(12) United States Patent
Yang et al.

(10) Patent No.: US 8,405,215 B2
(45) Date of Patent: Mar. 26, 2013

(54) INTERCONNECT STRUCTURE AND METHOD FOR CU/ULTRA LOW K INTEGRATION

(75) Inventors: Chih-Chao Yang, Glenmont, NY (US); Conal E. Murray, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 159 days.

(21) Appl. No.: 12/906,580

(22) Filed: Oct. 18, 2010

(65) Prior Publication Data
US 2011/0031623 A1 Feb. 10, 2011

Related U.S. Application Data

(62) Division of application No. 12/025,297, filed on Feb. 4, 2008, now Pat. No. 7,846,834.

(51) Int. Cl.
*H01L 23/52* (2006.01)

(52) U.S. Cl. . 257/751; 257/758; 257/774; 257/E21.495; 257/E23.141; 438/643

(58) Field of Classification Search .......... 438/618–622, 438/645, 631, 648, 700–706
See application file for complete search history.

(56) References Cited

U.S. PATENT DOCUMENTS

| | | | |
|---|---|---|---|
| 4,184,909 A | 1/1980 | Chang et al. | |
| 5,933,753 A | 8/1999 | Simon et al. | |
| 5,985,762 A | 11/1999 | Geffken et al. | |
| 6,429,519 B1 | 8/2002 | Uzoh | |
| 6,784,105 B1 | 8/2004 | Yang et al. | |
| 7,528,066 B2 | 5/2009 | Yang et al. | |
| 2006/0019485 A1 | 1/2006 | Komai et al. | |
| 2006/0125100 A1 | 6/2006 | Arakawa | |
| 2007/0037385 A1 | 2/2007 | Huebinger et al. | |
| 2007/0049007 A1 | 3/2007 | Yang et al. | |
| 2007/0202689 A1 | 8/2007 | Choi et al. | |
| 2007/0205482 A1 | 9/2007 | Yang et al. | |

FOREIGN PATENT DOCUMENTS

| | | |
|---|---|---|
| JP | 2005294364 | 10/2005 |
| WO | W02006089959 A1 | 8/2006 |
| WO | W02007099428 A1 | 9/2007 |

OTHER PUBLICATIONS

Liang, M. -Si, "Challenges in Cu/Low k Integration", IEEE Int. Electron Devices Meeting, 313, 2004.

(Continued)

*Primary Examiner* — Mamadou Diallo
(74) *Attorney, Agent, or Firm* — Scully, Scott, Murphy & Presser, P.C.; Louis J. Percello, Esq.

(57) ABSTRACT

A semiconductor structure is provided that includes a lower interconnect level including a first dielectric material having at least one conductive feature embedded therein; a dielectric capping layer located on the first dielectric material and some, but not all, portions of the at least one conductive feature; and an upper interconnect level including a second dielectric material having at least one conductively filled via and an overlying conductively filled line disposed therein, wherein the conductively filled via is in contact with an exposed surface of the at least one conductive feature of the first interconnect level by an anchoring area. Moreover, the conductively filled via and conductively filled line of the inventive structure are separated from the second dielectric material by a single continuous diffusion barrier layer. As such, the second dielectric material includes no damaged regions in areas adjacent to the conductively filled line. A method of forming such an interconnect structure is also provided.

20 Claims, 8 Drawing Sheets

OTHER PUBLICATIONS

Edelstein, D. et al., "Comprehensive Reliability Evaluation of a 90 nm CMOS Technology with Cu/PECVD Low k BEOL", IEEE Int. Reliability Physics Symp., 316, 2004.

Japanese Patent Application No. 2007 294625A dated Nov. 8, 2007, English-language abstract only.

Japanese Patent Application No. 2007 335578A dated Dec. 27, 2007, English-language abstract only.

INTERCONNECT STRUCTURE AND METHOD FOR CU/ULTRA LOW K INTEGRATION

CROSS REFERENCE TO RELATED APPLICATION

This application is a divisional of U.S. patent application Ser. No. 12/025,297, filed Feb. 4, 2008 the entire content and disclosure of which is incorporated herein by reference.

FIELD OF THE INVENTION

The present invention relates to a semiconductor structure and a method of fabricating the same. More particularly, the present invention relates to an interconnect structure that has high technology extendibility and reliability. The present invention also provides a method of fabricating such an interconnect structure in which a single material etching process is utilized.

BACKGROUND

Generally, semiconductor devices include a plurality of circuits which form an integrated circuit fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene wiring structures. Within a typical interconnect structure, metal vias run perpendicular to the semiconductor substrate and metal lines run parallel to the semiconductor substrate.

As millions and millions of devices and circuits are squeezed on a semiconductor chip, the wiring density and the number of metal levels are both increased generation after generation. In order to provide low RC for high signal speed, low k dielectric materials having a dielectric constant of less than silicon dioxide as well as copper-containing lines are becoming a necessity. The quality of thin metal wirings and studs formed by a conventional damascene process is extremely important to ensure yield and reliability.

The major problem encountered in this area today is poor mechanical integrity of deep submicron metal studs embedded in low k dielectric materials, which can cause unsatisfied thermal cycling and stress migration resistance in interconnect structures. This problem becomes more severe when either new metallization approaches or porous low k dielectric materials are used.

To solve this weak mechanical strength issue while employing copper damascene and low k dielectric materials in an interconnect structure, a so called "via punch-through" technique has been adopted by the semiconductor industry. The via punch-through provides a via gouging feature (or anchoring area) within the interconnect structure. Via gouging features are reported to achieve a reasonable contact resistance as well as an increased mechanical strength of the contact stud. See, for example, in M.-Si Liang "Challenges in Cu/Low k Integration", IEEE Int. Electron Devices Meeting, 313 (2004), D. Edelstein et al. "Comprehensive Reliability Evaluation of a 90 nm CMOS Technology with Cu/PECVD Low k BEOL", IEEE Int. Reliability Physics Symp., 316 (2004), and U.S. Pat. Nos. 4,184,909 to Chang et al., 5,933,753 to Simon et al., 5,985,762 to Geffken et al., 6,429,519 to Uzoh and 6,784,105 to Yang et al.

However, the argon sputtering technique that is used to create via gouging in the prior art not only removes the deposited liner material, e.g., TaN, from the trench (i.e., line opening) bottom, but also damages the low k dielectric material; the damage is in the form of increased surface roughness which forms at the bottom of the trench formed into the low k dielectric material. Because of the requirement of creating the gouging feature, the final interconnect structure not only has poor liner coverage at the trench bottom, but severe damage has been introduced into the low k dielectric material from the Ar sputtering process. This becomes a major yield detractor and a reliability concern for advanced chip manufacturing.

The detailed processing steps of the existing prior art approach for via gouging are illustrated in FIGS. 1A-1E and are described herein below. Reference is first made to FIG. 1A which illustrates a prior art structure that is formed after dual damascene patterning of an upper interconnect level 108 which is located atop a lower interconnect level 100. The lower interconnect level 100 includes a first low k dielectric material 102 which includes a metallic, Cu, feature 104 therein. The lower interconnect level 100 is separated in part from the upper interconnect level 108 by a capping layer 106. The upper interconnect level 108 includes a second low k dielectric material 110 that includes both line 112 and via 114 openings located therein. A surface of the metallic feature 104 of the lower interconnect level 100 that is beneath the via opening 114 is exposed as is shown in FIG. 1A.

FIG. 1B shows the prior art structure of FIG. 1A after forming a diffusion barrier, e.g., TaN, 116 over all of the exposed surfaces. Argon sputtering, such as is shown in FIG. 1C, is then performed to clean the bottom horizontal surface within the via opening 114 and form a gouging feature (i.e., anchoring area) 118 into the metallic feature 104 of the lower interconnect level 100. The gouging feature 118 is employed to enhance the interconnect strength between the various interconnect levels shown. During the Ar sputtering process, the diffusion barrier 116 is removed from the bottom of each of the line openings 112, and dielectric damages 120 (which are indicated by circles in the second low k dielectric material 110) are formed at the bottom of each of the line openings 112. The dielectric damages 120 formed during the sputtering process are due to the inherent aggressive nature of prior art sputtering processes.

FIG. 1D shows the prior art structure of FIG. 1C after forming a metal liner layer, e.g., Ta, Ru, Ir, Rh or Pt, 122 on the exposed surfaces thereof. FIG. 1E illustrates the prior art structure after filling the line and via openings (112 and 114, respectively) with a conductive metal, e.g., Cu, 124 and planarization. As shown in FIG. 1E, the prior art structure has poor diffusion barrier 116 coverage (designated by reference numeral 126) at the bottom of the metallic filled lines and a feature-bottom roughness which is a result of the damages 120 formed into the second low k dielectric material 110. Both of these characteristics reduce the quality of the diffusion barrier 116 and degrade the overall wiring reliability. Moreover, both of the aforementioned characteristics result in the structure exhibiting a high-level of metal-to-metal leakage.

Porous ultra-low k dielectric materials (having a dielectric constant of about 2.8 or less) have been developed and have been used in interconnect structures as one of the interlevel dielectrics. As compared to dense (i.e., non-porous) low k dielectrics, the damage impact of argon sputtering is much higher on most ultra-low k dielectric materials tested, which makes integration of the current metallization approach (See FIGS. 1A-1E, for example) with ultra-low k dielectric materials nearly impossible. As a result, all of the current ultra-low k hardware has failed during barrier integrity testing.

In view of the above drawbacks with prior art interconnect structures, and particularly in those including a porous ultra-low k dielectric as one of the interlevel dielectric materials, there is a continued need for developing a new and improved integration scheme that avoids the problem mentioned above with prior art interconnect integration schemes.

U.S. Patent Application Publication No. 2007/0205482 A1 to Yang et al. (hereinafter the '482 publication) provides one possible solution to the above-mentioned problem. Specifically, the '482 publication provides a method of fabricating a semiconductor interconnect structure in which the damages mentioned above with respect to prior art processing have been eliminated. The method of the '482 publication includes first providing an initial interconnect structure that includes a lower interconnect level comprising a first dielectric material having at least one conductive feature embedded therein, an upper interconnect level comprising a second dielectric material having at least one via opening that exposes a portion of the at least one conductive feature located atop the lower interconnect level, said lower and upper interconnect levels are separated in part by a dielectric capping layer, and a patterned hard mask on a surface of the upper interconnect level. A first barrier layer is then formed on all exposed surfaces of the initial interconnect structure including atop the patterned hard mask, on the sidewalls of the second dielectric material within the at least one opening and on the at least one conductive feature formed in the first dielectric material. A punch-through gouging feature is then formed into the at least one conductive feature that is located at the bottom of the via opening by Ar sputtering; the Ar sputtering process removes the first diffusion barrier layer from all horizontal surfaces of the structure, while leaving a portion of the first barrier layer along the sidewalls of the at least one opening formed into the second dielectric layer. A metallic interfacial layer is thereafter optionally formed atop the gouging feature.

Next, at least one line opening is formed in the second dielectric material that extends above the at least one via opening. Any etching residues are removed from the at least one line opening and from the at least one via opening utilizing a surface cleaning process such as, for example, wet chemical etching and/or a slight Ar bombardment. Next, a second continuous diffusion barrier layer is formed at least within the at least one line opening, and then an adhesion/plating seed layer is formed within both the at least one line opening and the at least one via opening. The at least one line opening and at least one via opening are then filled with a conductive material.

The resultant interconnect structure formed by this process includes the presence of two different barrier materials within the conductively filled opening. See, for example, FIGS. 12A-12B of the '482 publication in which reference numeral 30 represents the first barrier material and reference numeral 46 represents the second barrier material). Also, the prior art process includes the use of a simultaneous metal/dielectric etching process during the formation of the at least one line opening. Currently, the processing scheme of the '482 publication is not a preferred process for manufacturing interconnect structures.

As such, there is still a demand for providing an improved interconnect integration scheme that avoids the problems mentioned above with prior art interconnect integration schemes.

SUMMARY

The present invention provides an integration approach for interconnect technology qualification and extendibility, which is targeted on low k dielectric materials and requires a via gouging feature to ensure high reliability. In the inventive method, a single material etching process is used in defining the line openings and a single continuous diffusion barrier material is present lining the line opening and the underlying and abutting via openings.

In a first aspect of the present invention, a semiconductor structure is provided that comprises:

a lower interconnect level including a first dielectric material having at least one conductive feature embedded therein;

a dielectric capping layer located on said first dielectric material and some, but not all, portions of the at least one conductive feature; and an upper interconnect level including a second dielectric material having at least one conductively filled via and an overlying conductively filled line disposed therein, wherein said conductively filled via is in contact with an exposed surface of the at least one conductive feature of said first interconnect level by an anchoring area, wherein said conductively filled via and conductively filled line are separated from said second dielectric material by a single continuous diffusion barrier layer thereby the second dielectric material includes no damaged regions in areas adjacent to said conductively filled line.

In one embodiment of the present invention, the first and second dielectric materials comprise the same or different low k dielectric having a dielectric constant of about 4.0 or less. The low k dielectric materials may be porous or non-porous (i.e., dense) and may include, but are not limited to $SiO_2$, silsesquioxanes, C doped oxides (i.e., organosilicates) that include atoms of Si, C, O and H, thermosetting polyarylene ethers, or multilayers thereof.

In another embodiment of the inventive semiconductor structure, the dielectric capping layer may comprises one of SiC, $Si_4NH_3$, $SiO_2$, a carbon doped oxide, a nitrogen and hydrogen doped silicon carbide SiC(N,H) and multilayers thereof.

In a further embodiment of the inventive semiconductor structure, the at least one conductive feature embedded within said first dielectric material may include Cu or a Cu-containing alloy.

In a yet further embodiment of the inventive semiconductor structure, the at least one conductively filled via and said at least one overlying conductively filled line may comprise Cu or a Cu-containing alloy.

In a still further embodiment of the inventive semiconductor structure, the single continuous diffusion barrier layer may comprise a metal-containing material such as, TaN, Ta, Ti, TiN, RuTa, RuTaN, W, WN, Ru or Ir.

In an even further embodiment of the inventive semiconductor structure, an adhesion/plating seed layer is present and is located on the single continuous diffusion barrier layer. In this embodiment of the inventive semiconductor structure, the adhesion/plating seed layer may comprise one of Ru, TaRu, Ir, Rh, Pt, Pd, Ta, Cu and alloys thereof.

In another embodiment of the inventive semiconductor structure, a metallic interfacial layer is also present within the anchoring area; the metallic interfacial layer is located on a surface of the conductive feature in the first dielectric material. The metallic interfacial layer may comprise Co, TaN, Ta, Ti, TiN, Ru, Ir, Au, Rh, Pt, Pd, Ag or alloys thereof.

In a second aspect of the present invention, a semiconductor structure is also provided that comprises:

a lower interconnect level including a first dielectric material having at least one conductive feature embedded therein;

a dielectric capping layer located on said first dielectric material and some, but not all, portions of the at least one conductive feature;

an upper interconnect level including a second dielectric material having at least one conductively filled via and an overlying conductively filled line disposed therein, wherein said conductively filled via is in contact with said at least one conductive feature in said at least one first interconnect level by an anchoring area; and a metallic interfacial layer located at a surface of said anchoring area and is in contact with said conductively filled via, wherein said conductively filled via and said conductively filled line are separated from said second dielectric material by a single continuous diffusion barrier layer thereby the second dielectric material includes no damaged regions in areas adjacent to said conductively filled line.

In this aspect of the present invention many of the embodiments mentioned above with respect to the first aspect of the present invention are applicable here for the second aspect of the present invention.

In a third aspect of the present invention, a method of fabricating a semiconductor structure is provided that comprises:

providing an initial interconnect structure that includes a lower interconnect level comprising a first dielectric layer having at least one conductive feature embedded therein, an upper interconnect level comprising a second dielectric having at least one via opening that exposes a portion of said at least one conductive feature located atop said lower interconnect level, said lower and upper interconnect levels are separated in part by a dielectric capping layer, and a patterned hard mask on a surface of the said upper interconnect level;

forming a punch-through gouging feature in said at least one conductive feature that is located at the bottom of said via opening;

forming at least one line opening in said second dielectric material that extends above said at least one via opening;

forming a single continuous diffusion barrier layer within said at least one line and via openings; and filling said at least one line opening and at least one via opening with a conductive material.

In one embodiment of the inventive method, the providing the initial interconnect structure includes forming at least one conductive feature within the first dielectric material, forming a blanket dielectric capping layer on the first dielectric material, forming the second dielectric material on the blanket dielectric capping layer, forming a patterned hard mask having via patterns on the second dielectric material, and transferring the via patterns into the second dielectric material and the blanket dielectric capping layer.

In another embodiment of the inventive method, the step of forming the punch-through gouging feature comprises gaseous sputtering comprising one of Ar, He, Ne, Xe, $N_2$, $H_2$, $NH_3$, $N_2H_2$ and mixtures thereof. Of these sputtering techniques, sputtering in Ar is a highly preferred embodiment of the inventive method.

In a further embodiment of the inventive method, the step of forming the at least one line opening comprises filling said at least one via opening with a planarization material, said planarization material extending above said via opening, forming a second hard mask on said planarization material, forming a patterned photoresist having a line pattern on said second hard mask, and transferring said line pattern to said second hard mask and an upper portion of said second dielectric material.

In a yet further embodiment of the inventive method, the single continuous diffusion barrier layer is formed by depositing at least one of Ta, TaN, Ti, TiN, Ru, RuN, RuTa, RuTaN, W and WN.

In a still further embodiment of the present invention, an optional adhesion/plating seed layer is formed on the single continuous diffusion barrier. When present, the optional adhesion plating seed layer is formed by depositing one of Ru, TaRu, Ir, Rh, Pt, Pd, Cu and alloys thereof.

In an even further embodiment of the inventive method, the filling step comprises depositing at least one of Cu, Al, W and alloys thereof.

In a yet further embodiment of the inventive method, a planarization step is performed after the filling with said conductive material, wherein said planarization step provides a conductive filled line that has an upper surface that is coplanar with an upper surface of said second dielectric material.

In the inventive method described above, the at least one via opening is formed by lithography and etching, and the etching causes vertical sidewalls of the second dielectric material to be damaged. Also, during the formation of the punch-through gouging feature, Cu (and/or other conductive materials) from the underneath interconnect would be re-sputtered onto sidewalls of the at least one via opening. In this case, the re-sputtered Cu (and/or other conductive materials) would be attached atop the damaged dielectric. To remove the damaged vertical sidewalls and the re-sputtered metallic materials from the structure, a cleaning step is performed. The cleaning step may comprise wet cleaning, dry cleaning or a combination thereof. In a highly preferred embodiment of this invention, the cleaning process comprises a wet cleaning process wherein DHF or DI is used.

In a fourth aspect of the present invention, another method is provided that comprises:

providing an initial interconnect structure that includes a lower interconnect level comprising a first dielectric layer having at least one conductive feature embedded therein, an upper interconnect level comprising a second dielectric having at least one via opening that exposes a portion of said at least one conductive feature located atop said lower interconnect level, said lower and upper interconnect levels are separated in part by a dielectric capping layer, and a patterned hard mask on a surface of the said upper interconnect level;

forming a punch-through gouging feature in said at least one conductive feature that is located at the bottom of said via opening;

forming a metallic interfacial layer atop said gouging feature;

forming at least one line opening in said second dielectric material that extends above said at least one via opening;

removing etching residues from said at least one line opening and from said at least one via opening;

forming a single continuous diffusion barrier layer within said at least one via opening and said at least one line opening;

forming an adhesion/plating seed layer on a surface of said single continuous diffusion barrier layer; and filling said at least one line opening and at least one via opening with a conductive material.

In the fourth aspect of the present invention, many of the embodiments mentioned above with respect to the third aspect of the invention are applicable here as well.

DETAILED DESCRIPTION

Figure 1A:
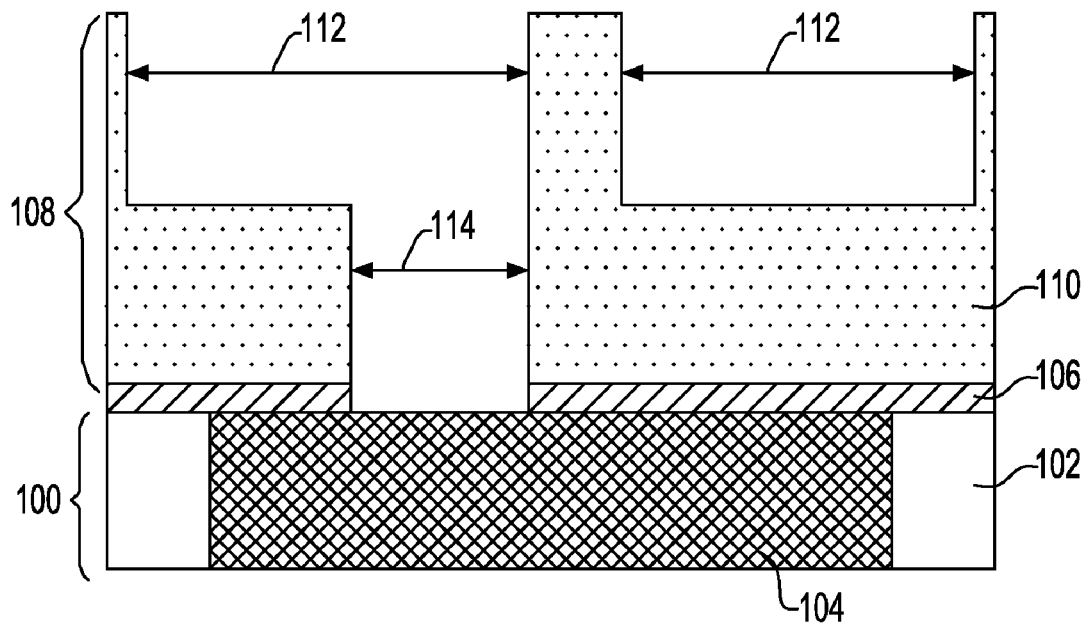
FIGS. 1A-1E are pictorial representations (through cross sectional views) illustrating the basic processing steps used in the prior art in forming an interconnect structure.
Figure 1B:
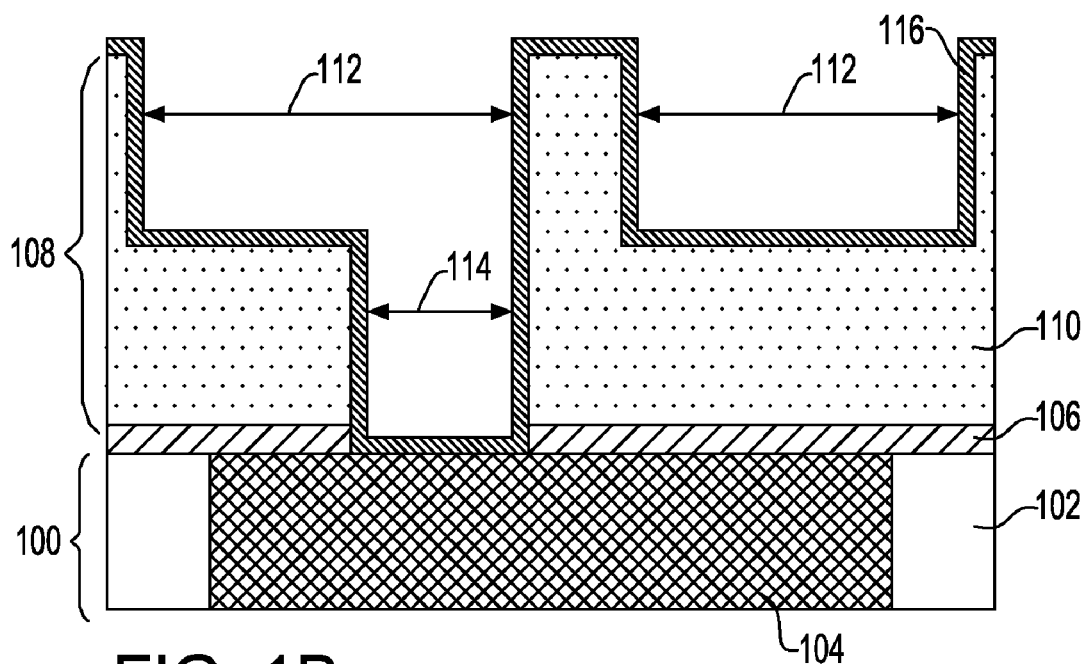
Figure 1C:
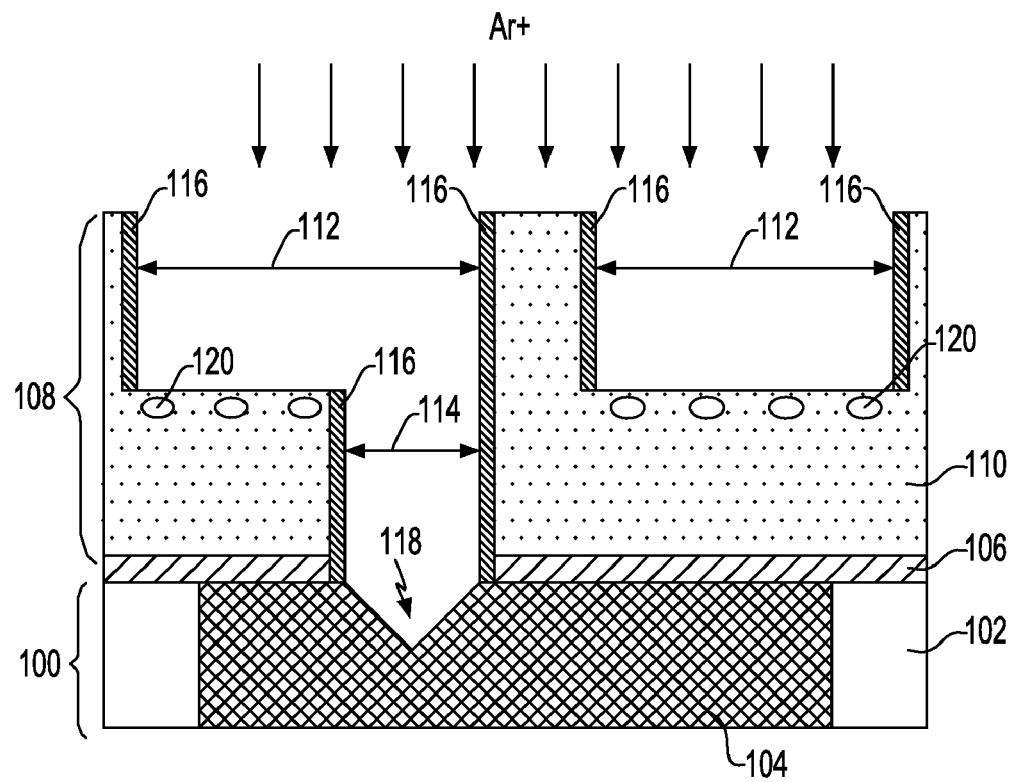
Figure 1D:
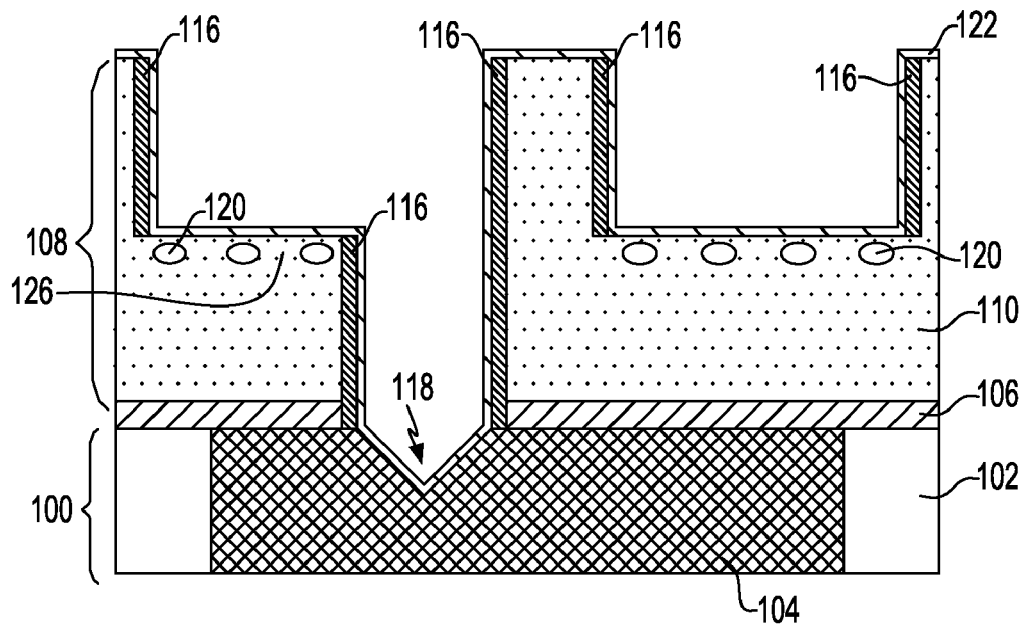
Figure 1E:
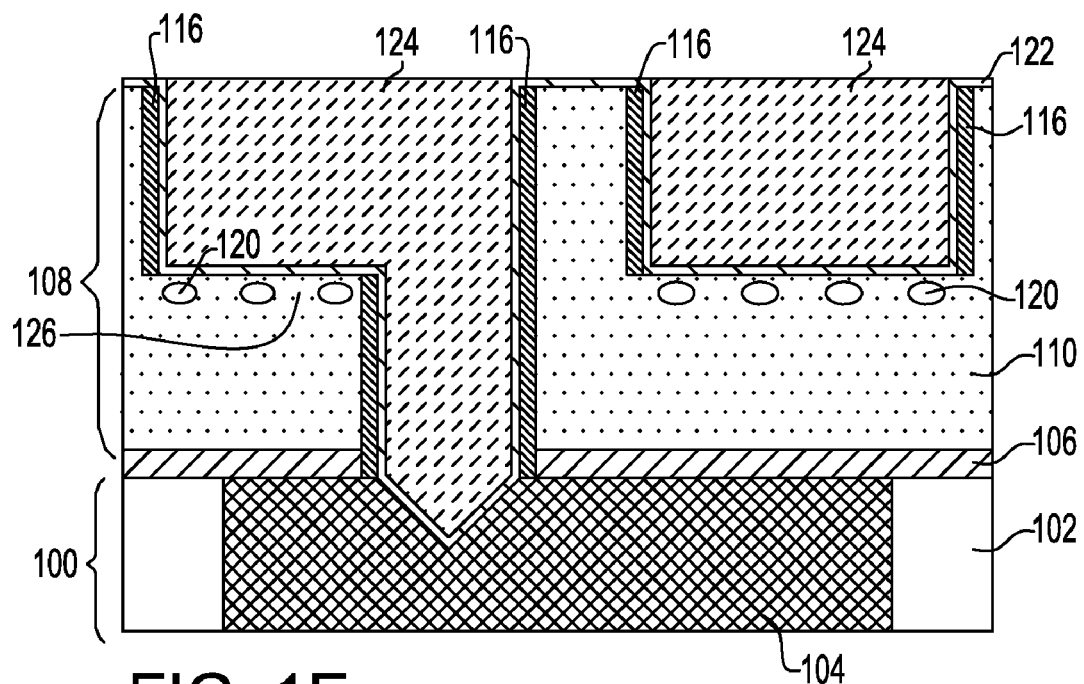

The present invention, which provides an interconnect structure having technology extendibility and high reliability and a method of fabricating the same, will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As stated above, the present invention provides a semiconductor structure, i.e., an interconnect structure that has technology extendibility and high reliability. More specifically, the inventive structure includes (See, FIGS. 2-11) a lower interconnect level 12 including a first dielectric material 18 having at least one conductive feature 20 embedded therein; a dielectric capping layer 14 located on said first dielectric material 18 and some, but not all, portions of the at least one conductive feature 20; and an upper interconnect level 16 including a second dielectric material 24 having at least one conductively filled via and an overlying conductively filled line disposed therein (represented collectively by reference numeral 50), wherein said conductively filled via (lower portion of 50) is in contact with an exposed surface of the at least one conductive feature 20 of said first interconnect level 12 by an anchoring area. Moreover, the conductively filled via and conductively filled line of the inventive structure are separated from said second dielectric material 24 by a single continuous diffusion barrier layer 46. As such, the second dielectric material 24 includes no damaged regions in areas adjacent to said conductively filled line.

Figure 2:
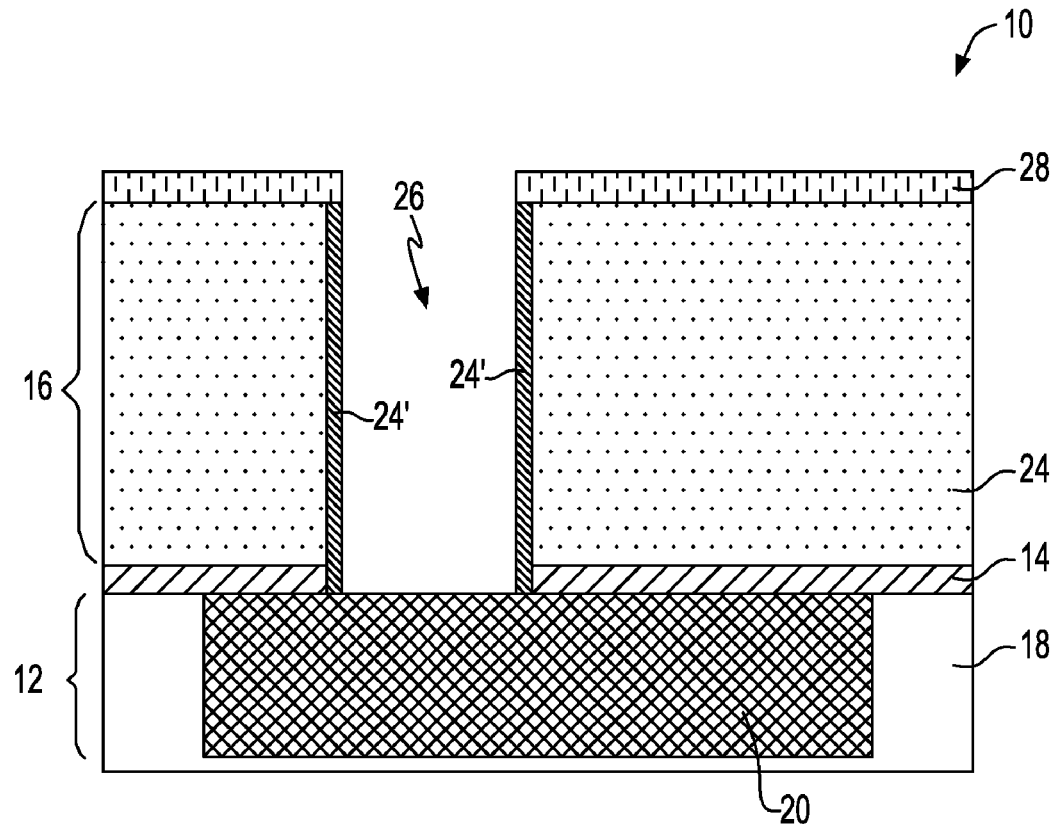
FIGS. 2-11 are pictorial representations (through cross sectional views) depicting the basic processing steps that are employed in the present invention for fabricating an interconnect structure that has technology extendibility and high reliability.

The process flow of the present invention which fabricates the inventive structure described above begins with providing the initial interconnect structure 10 shown in FIG. 2. Specifically, the initial interconnect structure 10 shown in FIG. 2 comprises a multilevel interconnect including a lower interconnect level 12 and an upper interconnect level 16 (partially formed at this stage of the present invention) that are separated in part by a dielectric capping layer 14. The lower interconnect level 12, which may be located above a semiconductor substrate (not shown) including one or more semiconductor devices, comprises a first dielectric material 18 having at least one conductive feature (i.e., a conductive region) 20 that is separated from the first dielectric material 18 by a barrier layer (not shown). The upper interconnect level 16 comprises a second dielectric material 24 that has at least one via opening 26 located therein. As is shown, the at least one via opening 26 exposes a portion of the conductive feature 20. Atop the upper interconnect level 16 is a patterned hard mask 28. Although the structure shown in FIG. 2 illustrates a single via opening 26, the present invention contemplates forming any number of such via openings in the second dielectric material 24 which exposes other conductive features 20 that may be present in the first dielectric material 18.

The initial structure 10 shown in FIG. 2 is made utilizing conventional techniques well known to those skilled in the art. For example, the initial interconnect structure can be formed by first applying the first dielectric material 18 to a surface of a substrate (not shown). The substrate, which is not shown, may comprise a semiconducting material, an insulating material, a conductive material or any combination thereof. When the substrate is comprised of a semiconducting material, any semiconductor such as Si, SiGe, SiGeC, SiC, Ge alloys, GaAs, InAs, InP and other III/V or II/VI compound semiconductors may be used. In addition to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combination thereof including multilayers. When the substrate is a conducting material, the substrate may include, for example, polySi, an elemental metal, alloys of elemental metals, a metal silicide, a metal nitride or combinations thereof including multilayers. When the substrate comprises a semiconducting material, one or more semiconductor devices such as, for example, complementary metal oxide semiconductor (CMOS) devices can be fabricated thereon.

The first dielectric material 18 of the lower interconnect level 12 may comprise any interlevel or intralevel dielectric including inorganic dielectrics or organic dielectrics. The first dielectric material 18 may be porous or non-porous, with porous dielectrics having a dielectric constant of about 2.8 or less being highly preferred in some embodiments of the present invention. Some examples of suitable dielectrics that can be used as the first dielectric material 18 include, but are not limited to $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The first dielectric material 18 typically has a dielectric constant that is about 4.0 or less, with a dielectric constant of about 2.8 or less being even more typical. These dielectrics generally have a lower parasitic crosstalk as compared with dielectric materials that have a higher dielectric constant than 4.0. The thickness of the first dielectric material 18 may vary depending upon the dielectric material used as well as the exact number of dielectrics within the lower interconnect level 12. Typically, and for normal interconnect structures, the first dielectric material 18 has a thickness from about 200 to about 450 nm.

The lower interconnect level 12 also has at least one conductive feature 20 that is embedded in (i.e., located within) the first dielectric material 18. The conductive feature 20 comprises a conductive material that is separated from the first dielectric material 18 by a barrier layer (not shown). The conductive feature 20 is formed by lithography (i.e., applying a photoresist to the surface of the first dielectric material 18, exposing the photoresist to a desired pattern of radiation, and developing the exposed resist utilizing a conventional resist developer), etching (dry etching or wet etching) an opening in the first dielectric material 18 and filling the etched region with the barrier layer and then with a conductive material forming the conductive region.

The barrier layer, which may comprise Ta, TaN, Ti, TiN, Ru, RuN, W, WN or any other material that can serve as a barrier to prevent conductive material from diffusing there through, is formed by a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating. The thickness of the barrier layer may vary depending on the exact means of the deposition process as well as the material employed. Typically, the barrier layer has a thickness from about 4 to about 40 nm, with a thickness from about 7 to about 20 nm being more typical.

Following the barrier layer formation, the remaining region of the opening within the first dielectric material 18 is filled with a conductive material forming the conductive feature 20. The conductive material used in forming the conductive feature 20 includes, for example, polySi, a conductive metal, an alloy comprising at least one conductive metal, a conductive metal silicide or combinations thereof. Preferably, the conductive material that is used in forming the conductive feature 20 is a conductive metal such as Cu, W or Al, with Cu or a Cu alloy (such as AlCu) being highly preferred in the present invention. The conductive material is filled into the remaining opening in the first dielectric material 18 utilizing a conventional deposition process including, but not limited to CVD, PECVD, sputtering, chemical solution deposition or plating. After deposition, a conventional planarization process such as, for example, chemical mechanical polishing (CMP) can be used to provide a structure in which the barrier layer and the conductive feature 20 each have an upper surface that is substantially coplanar with the upper surface of the first dielectric material 18.

After forming the at least one conductive feature 20, a blanket dielectric capping layer 14 is formed on the surface of the lower interconnect level 12 utilizing a conventional deposition process such as, for example, CVD, PECVD, chemical solution deposition, or evaporation. The dielectric capping layer 14 comprises any suitable dielectric capping material such as, for example, SiC, $Si_4NH_3$, $SiO_2$, a carbon doped oxide, a nitrogen and hydrogen doped silicon carbide SiC(N, H) or multilayers thereof. The thickness of the capping layer 14 may vary depending on the technique used to form the same as well as the material make-up of the layer. Typically, the capping layer 14 has a thickness from about 15 to about 55 nm, with a thickness from about 25 to about 45 nm being more typical.

Next, the upper interconnect level 16 is formed by applying the second dielectric material 24 to the upper exposed surface of the capping layer 14. The second dielectric material 24 may comprise the same or different, preferably the same, dielectric material as that of the first dielectric material 18 of the lower interconnect level 12. The processing techniques and thickness ranges for the first dielectric material 18 are also applicable here for the second dielectric material 24. The second dielectric material 24 can also comprise two different materials, i.e., deposition of one dielectric material first, followed by deposition of a different dielectric material. In one embodiment of the present invention, the second dielectric material 24 comprises two different low k dielectric materials and thus the upper interconnect level 16 has a hybrid structure with the subsequently filled conductively filled line embedded in a porous dielectric material, and the subsequently filled via embedded in a dense (i.e., non porous) dielectric material. In such an embodiment, the porous low k dielectric has a dielectric constant of about 2.8 or less, and the dense porous low k dielectric has a dielectric constant of about 4.0 or less.

Next, at least one via opening 26 (which exposes at least a portion of the conductive feature 20) is formed into the second dielectric material 24 by first forming a blanket hard mask material atop the upper surface of the second dielectric material 24. The blanket hard mask material includes an oxide, nitride, oxynitride or any combination including multilayers thereof. Typically, the hard mask material is an oxide such as $SiO_2$ or a nitride such as $Si_3N_4$. The blanket hard mask material is formed utilizing a conventional deposition process such as, for example, CVD, PECVD, chemical solution deposition or evaporation. The thickness of the as-deposited hard mask material may vary depending upon the type of hard mask material formed, the number of layers that make up the hard mask material and the deposition technique used in forming the same. Typically, the as-deposited hard mask material has a thickness from about 10 to about 80 nm, with a thickness from about 20 to about 60 nm being even more typical.

After forming the blanket layer of hard mask material, a photoresist (not shown) is formed atop the hard mask material utilizing a conventional deposition process such as, for example, CVD, PECVD, spin-on coating, chemical solution deposition or evaporation. The photoresist may be a positive-tone material, a negative-tone material or a hybrid material, each of which is well known to those skilled in the art. The photoresist is then subjected to a lithographic process which includes exposing the photoresist to a pattern of radiation and developing the exposed resist utilizing a conventional resist developer. The lithographic step provides a patterned photoresist atop the hard mask material that defines the width of the via opening 26.

After providing the patterned photoresist, the via pattern is transferred into the hard mask material and then subsequently into the second dielectric material 24 utilizing one or more etching processes. The patterned photoresist can be stripped immediately after the via pattern is transferred into the hard mask forming patterned hard mask 28 utilizing a conventional stripping process. Alternatively, the patterned photoresist can be stripped after the via pattern is transferred into the second dielectric material 24. The etching used in transferring the via pattern may comprise a dry etching process, a wet chemical etching process or a combination thereof. The term "dry etching" is used herein to denote an etching technique such as reactive-ion etching, ion beam etching, plasma etching or laser ablation.

It is noted that during the formation of the via opening 26 into the second dielectric material 24 the sidewalls of the second dielectric material are damaged forming damaged sidewalls 24' shown in FIG. 2. The damaged sidewalls 24' are less dense as compared to the bulk material. This could be either chemical or physical in nature. For example, and when the second dielectric material 24 includes C as one of the atoms, the damaged sidewalls 24' of the second dielectric material 24 have a lower C content (i.e., C deficient) as compared to the remaining portions of the second dielectric material 24. When non-C containing dielectric materials are employed, the damaged sidewalls may be characterized as being porous.

Figure 3:
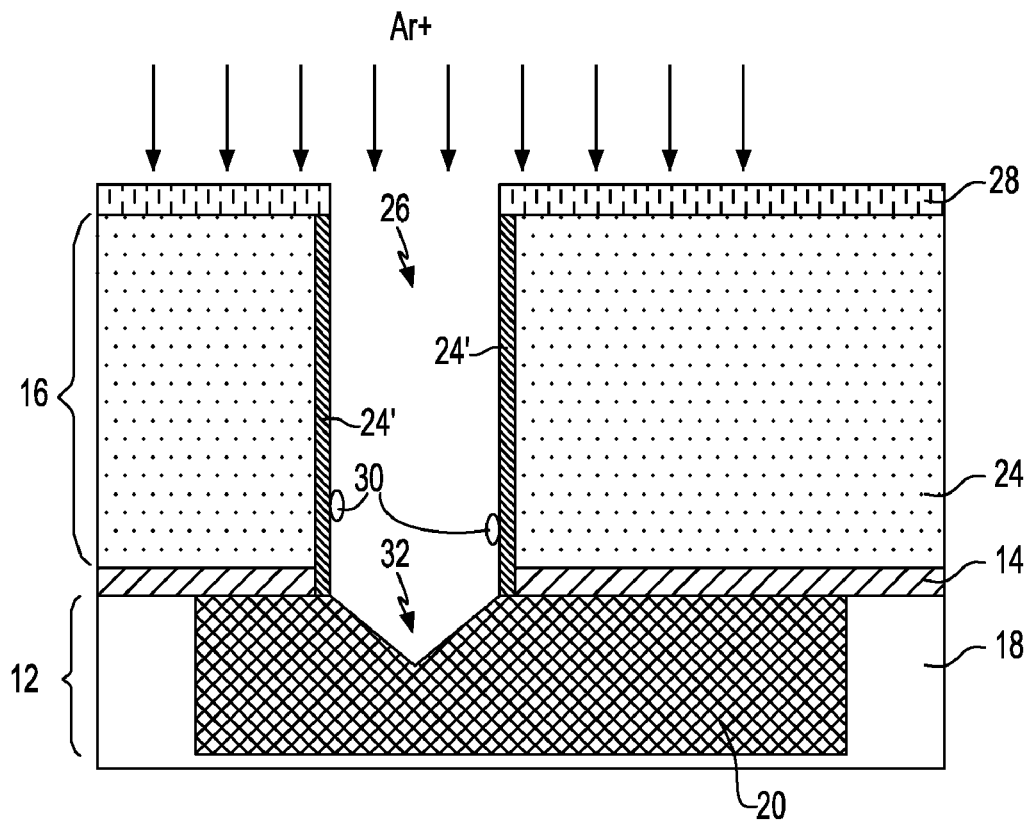

FIG. 3 illustrates the next step in the inventive method in which the initial interconnect structure 10 shown in FIG. 2 is subjected to an Ar sputtering process which punches through the underlying conductive feature 20 (i.e., by removing a portion of the conductive material within the conductive feature 20) so as to create a gouging feature (or anchoring area) 32 within the conductive feature 20. The second dielectric material 24 is not damaged during this process since it is protected by the hard mask 28. The Ar sputtering process utilized in forming the gouging feature 32 comprises any conventional Ar sputtering process that is typically used in interconnect technology to form such a feature. By way of illustration, Ar sputtering can be performed utilizing the following non-limiting conditions: gas flow of 20 sccm Ar, temperature of 25° C., bias of top electrode of 400 KHz and 750 W, table bias of 13.6 MHz and 400 W, and a process pressure of 0.6 mtorr. While Ar is shown for purpose of illustration, any other gas such as He, Ne, Xe, $N_2$, $H_2$, $NH_3$, $N_2H_2$, or mixtures thereof, can also be used for the sputtering process.

In some embodiments, residues 30 from the Ar sputtering process may be formed on the damaged sidewalls 24' of the second dielectric material 24. The residues 30 are undesirable since that may result in device reliability problems if left within the interconnect structure. The residues 30 are typically metallic-containing residues which are based on the conductive material within the conductive feature 20.

Figure 4:
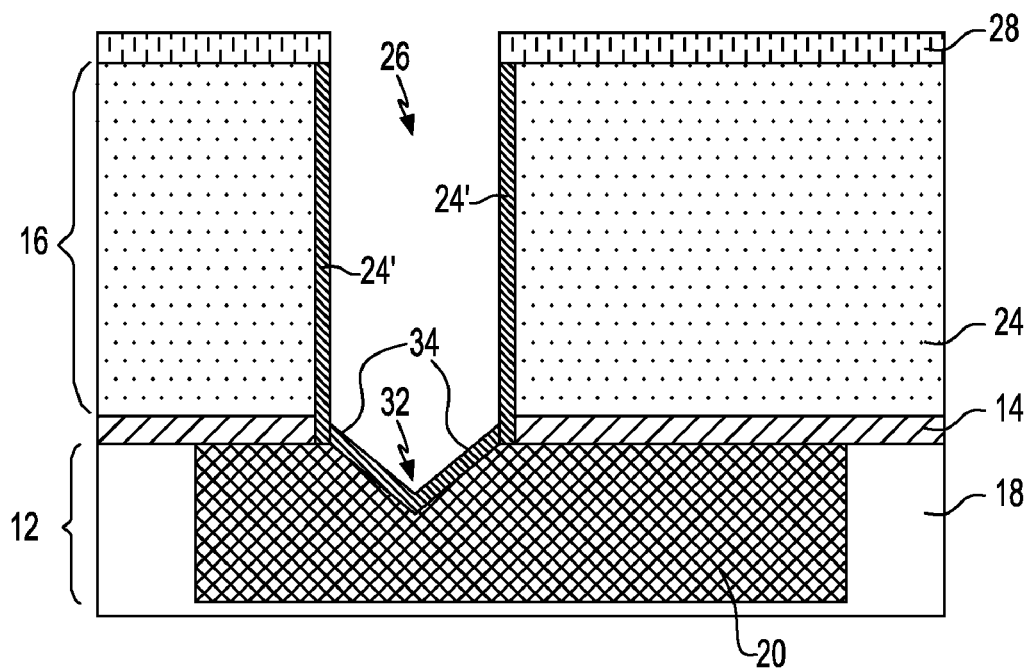

FIG. 4 shows an optional embodiment of the present invention in which a metallic interfacial layer 34 is selectively formed on the exposed upper surface of the remaining conductive feature 20 within the anchoring area 32. The metallic interfacial layer 34 is formed utilizing any conventional deposition process including, for example, CVD, PECVD, chemical solution deposition, evaporation, metalorgano deposition, ALD, or plating (electroless or electro). The thickness of the metallic interfacial layer 34 may vary depending on the exact metallic interfacial material used as well as the deposition technique that was used in forming the same. Typically, the metallic interfacial layer 34 has a thickness from about 0.5 to about 40 nm, with a thickness from about 1 to about 10 nm being even more typical. The metallic interfacial layer 34 comprises a metallic barrier material such as, for example, Co, TaN, Ta, Ti, TiN, Ru, Ir, Au, Rh, Pt, Pd or Ag. Alloys of such materials are also contemplated.

For sake of clarity, the remaining drawings and description are made with the assumption that the metallic interfacial layer 34 was not formed. Although such an embodiment is shown and described, the present invention including the following method steps work when the optional interfacial metallic layer 34 is present.

Next, the structure shown in FIG. 3 (or FIG. 4 if the optional interfacial metallic layer 34 is formed) is subjected to a cleaning step which removes the damaged layer 24' and the possible resides 30 from the sidewalls of the via opening 26. The resultant structure which is formed after performing the cleaning step is shown, for example, in FIG. 5. The cleaning process employed in the present invention comprises any cleaning process which is capable of removing the damaged sidewalls 24' and any residues from within the via opening 26 of the structure shown in either FIG. 3 or FIG. 4. Examples of such cleaning processes that are capable of removing the damaged sidewalls 24' and any residues 30 from within the via opening 26 include a wet clean such as contacting with DHF (i.e., dilute hydrofluoric acid) or DI (i.e., deionized water), a dry clean such as contacting with a gas or plasma of $NH_3$, $N_2$, $H_2$ or silane, and any combination thereof. Preferably, contacting with DHF is employed. The cleaning process has good removing selectivity between damaged dielectric and bulk dielectric (>100:1), and does not react with metallic materials, 34 and 20. A lift off process removes metallic residues 30 from the features simultaneously while removing the dielectric damaged layer 24' via the cleaning process.

Figure 5:
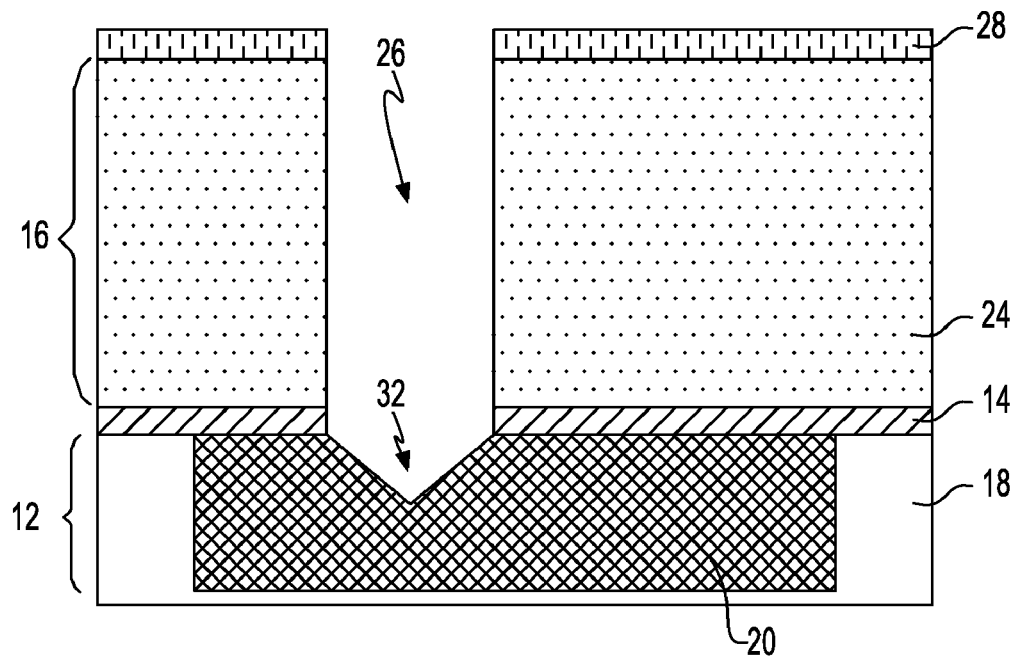
Figure 6:
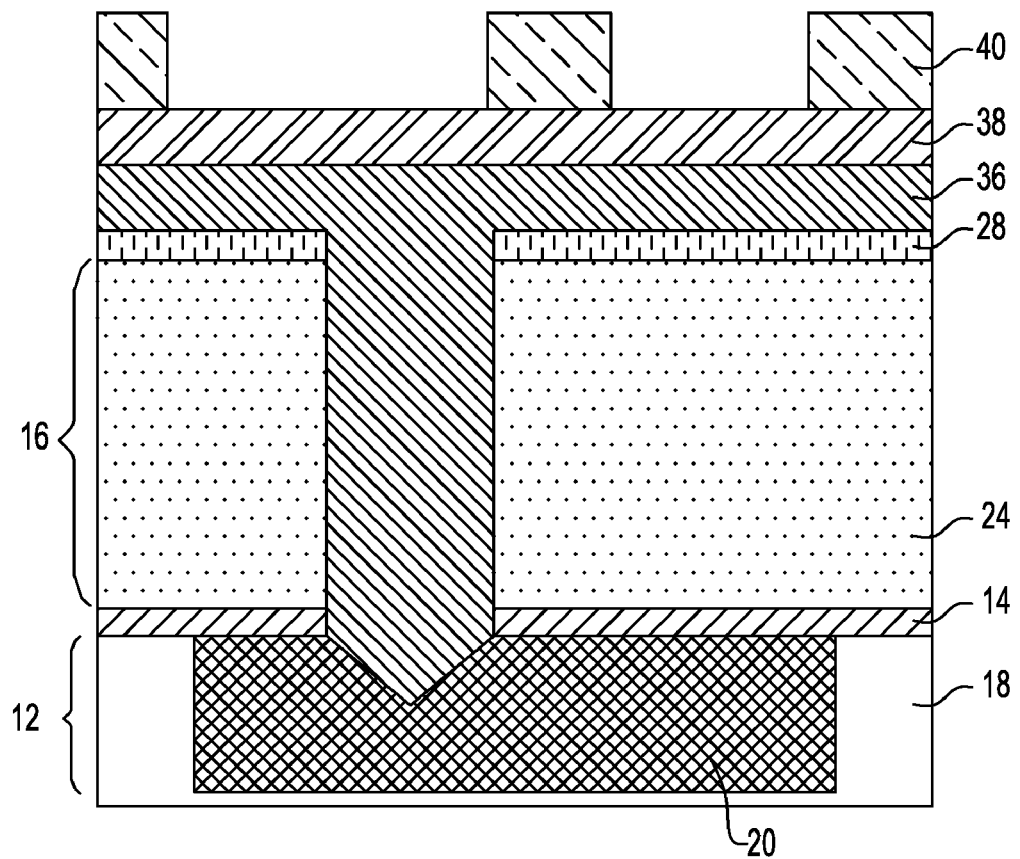

Next, a planarization layer 36, a second hard mask 38 and a patterned photoresist 40 are formed in the cleaned structure of FIG. 5 providing the structure shown, for example, in FIG. 6.

The planarization layer 36 is deposited utilizing a conventional deposition process including, for example, CVD, PECVD, spin-on coating, evaporation or chemical solution deposition. The planarization material includes a conventional antireflective coating material or a spun-glass material. Examples of suitable planarization materials include, for example, near frictionless carbon (NFC).

As shown in FIG. 6, the planarization layer 36 completes fills the via opening 26 as well as extending above the via opening 26 on the exposed surface of the hard mask 28 (as shown in FIG. 6). In addition to the planarization layer 36, the structure shown in FIG. 6 also includes a second hard mask 38 disposed on a surface of the planarization layer 36 and a patterned photoresist 40 disposed on a surface of the second hard mask 38. The second hard mask 38 is formed utilizing the same processing technique as described in forming the hard mask 28 and it is comprised of one of the hard mask materials mentioned above in connection with the hard mask 28. The patterned photoresist 40 is formed by deposition and lithography and it contains openings that have the width of a line opening.

Figure 7:
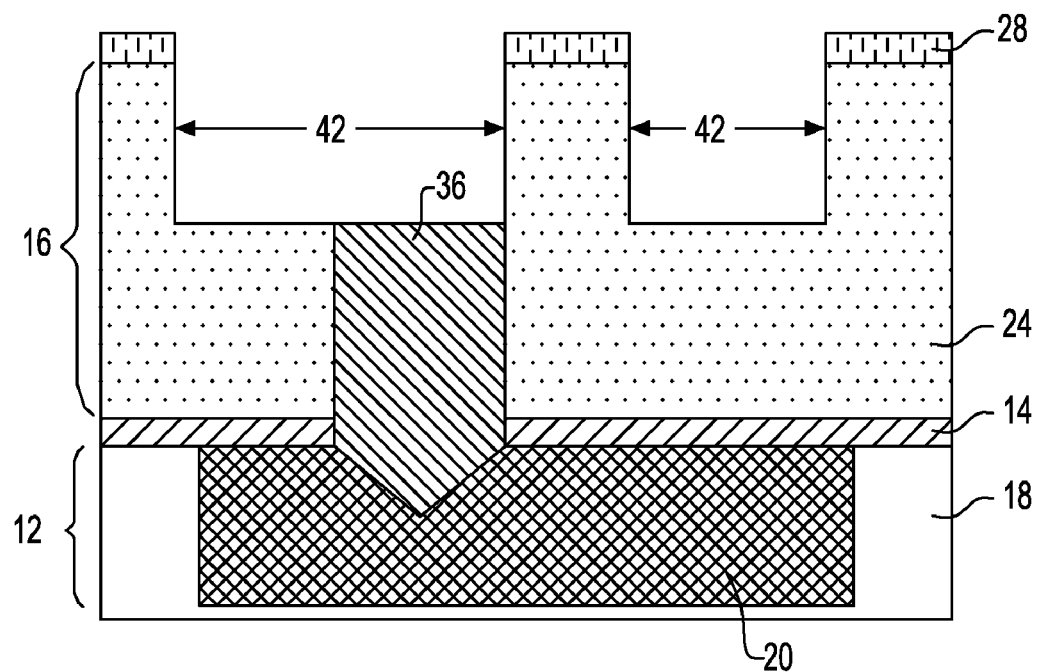

The structure shown in FIG. 6 is then subjected to one or more etching processes which are capable of forming the structure shown in FIG. 7. As shown in this figure, the one or more etching processes forms line openings 42 in the second dielectric material 24. In accordance with the present invention, at least one of the line openings 42 is located above and connect to the via opening 26, which is protected by the remaining planarization layer 36. The one or more etching steps remove, in sequential order, exposed portions of the second hard mask 38, the underlying portions of the planarization layer 36, and exposed portions of the second dielectric material 24. The patterned photoresist 40 and the patterned second hard mask 38 are typically consumed during the above mentioned etching steps. It is noted that in this step of the present invention the at least one line opening 42 is created by an etching process that removes only dielectric material from the structure, not a diffusion barrier material as may be the case in prior art interconnect structures.

Figure 8:
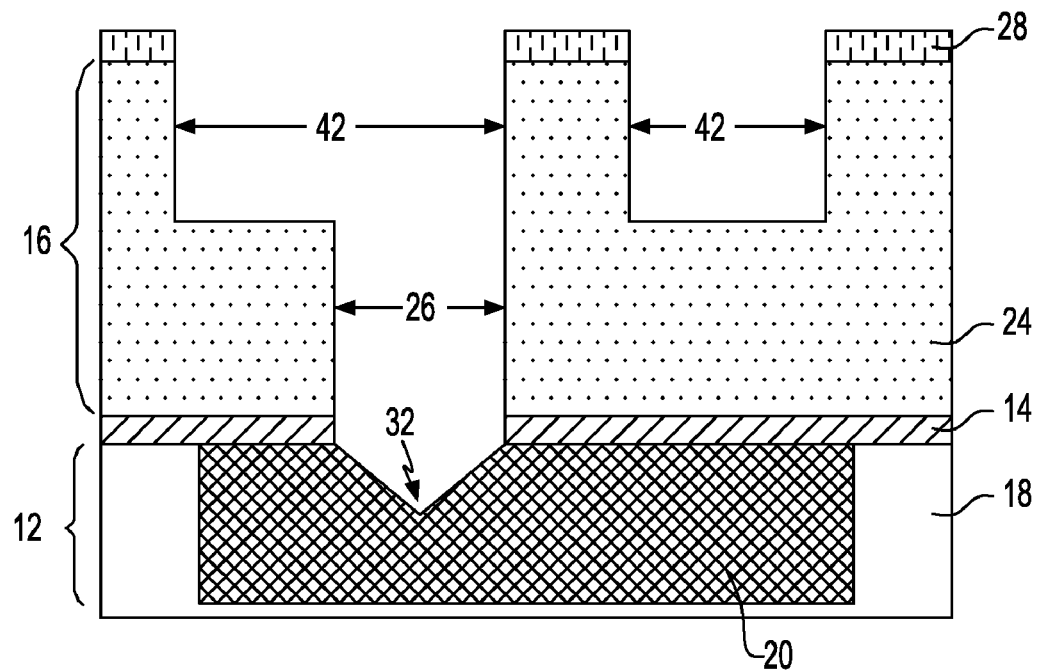

FIG. 8 shows the structure of FIG. 7 after the remaining planarization layer 36 has been stripped from within the via opening 26. The stripping of the remaining planarization layer 36 is performed utilizing either a chemical wet etching process or a chemical ashing process that is selective in removing the planarizing material from the structure. In some embodiments of the present invention, oxide or etch residue (not shown) may remain in the gouging feature 32.

In such instances, the oxide or etch residue can be removed from the gouging feature 32 utilizing a surface cleaning process that may include a wet chemical etching process and/or a slight Ar bombardment. No damage occurs in this instance since the Ar bombardment conditions are not as harsh as that used in the prior art in forming the gouging feature 32. Typically, the process time used in the present case for only surface cleaning is less than 5 seconds compared to longer than 10 seconds for creating the gouging feature used in the prior art. By way of illustration, Ar sputtering can be performed utilizing the following non-limiting conditions: gas flow of 20 sccm Ar, temperature of 25° C., bias of top electrode of 400 KHz and 400 W, table bias of 13.6 MHz and 200 W, and a process pressure of 0.6 mtorr. While Ar is shown for purpose of illustration, any other gas such as He, Ne, Xe, $N_2$, $H_2$, $NH_3$, $N_2H_2$ or mixtures thereof, can also be used for the sputtering process.

In some embodiments of the present invention, etching residues are removed from the at least one line opening and from the at least one via opening. In one embodiment, plasma etching, which contains at least one or combination of $O_2$, $H_2$, $N_2$, CO, $CO_2$, or $NH_3$ is employed. In another embodiment, the etching residues are removed by a wet clean, which contains at least one or combination of HF, HCl, $H_2SO_4$, or $HNO_3$.

Figure 9:
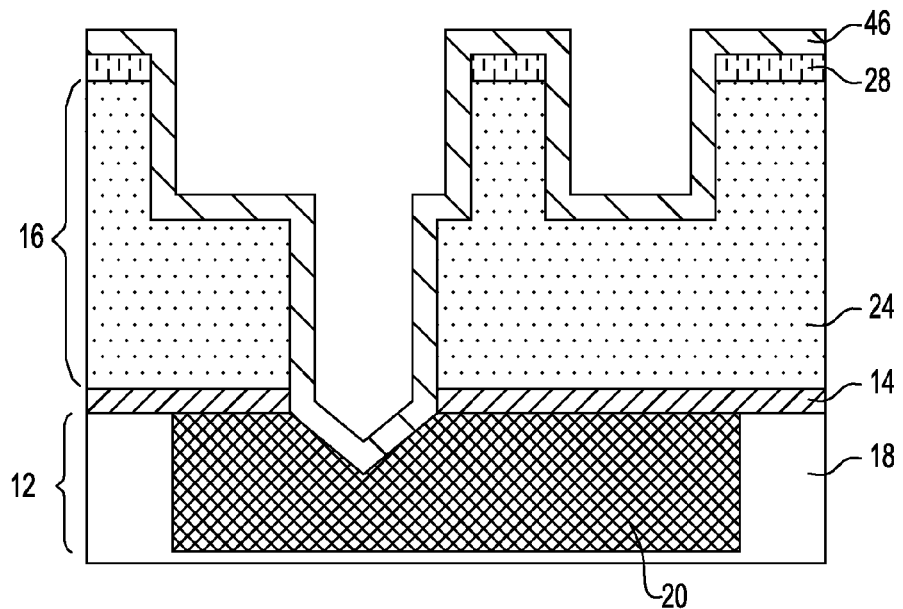

FIG. 9 illustrates the structure of FIG. 8 after a diffusion barrier 46 is formed on all exposed surfaces (horizontal and vertical). In accordance with the present invention, the diffusion barrier 46 comprises Ta, TaN, Ti, TiN, Ru, RuN, RuTa, RuTaN, W, WN or any other material that can serve as a barrier to prevent a conductive material from diffusing there through. Combinations of these materials are also contemplated forming a multilayered stacked diffusion barrier. The diffusion barrier 46 is formed utilizing a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating.

The thickness of the diffusion barrier 46 may vary depending on the number of material layers within the barrier, the technique used in forming the same as well as the material of the diffusion barrier itself. Typically, the diffusion barrier 46 has a thickness from about 4 to about 40 nm, with a thickness from about 7 to about 20 nm being even more typical.

In some embodiments, an adhesion/plating seed layer (not specifically shown) is also formed atop the diffusion barrier 46; in embodiments when the adhesion/plating seed layer is used, reference numeral 46 shown in FIG. 9 represents a material stack including both the diffusion barrier and the optional adhesion/plating seed layer. When employed, the optional adhesion/plating seed layer is comprised of a metal or metal alloy from Group VIIIA of the Periodic Table of Elements. Examples of suitable Group VIIIA elements for the adhesion/plating seed layer include, but are not limited to Ru, TaRu, Ir, Rh, Pt, Pd and alloys thereof. In some embodiments, it is preferred to use Ru, Ir or Rh as the optional adhesion/plating seed layer. The optional adhesion/plating seed layer is formed by a conventional deposition process including, for example, chemical vapor deposition (CVD), plasma enhanced chemical vapor deposition (PECVD), atomic layer deposition (ALD), plating, sputtering and physical vapor deposition (PVD). The thickness of the optional adhesion/plating seed layer may vary depending on number of factors including, for example, the compositional material of the adhesion/plating seed layer and the technique that was used in forming the same. Typically, the optional adhesion/plating seed layer has a thickness from about 0.5 to about 10 nm, with a thickness of less than 6 nm being even more typical.

Figure 10:
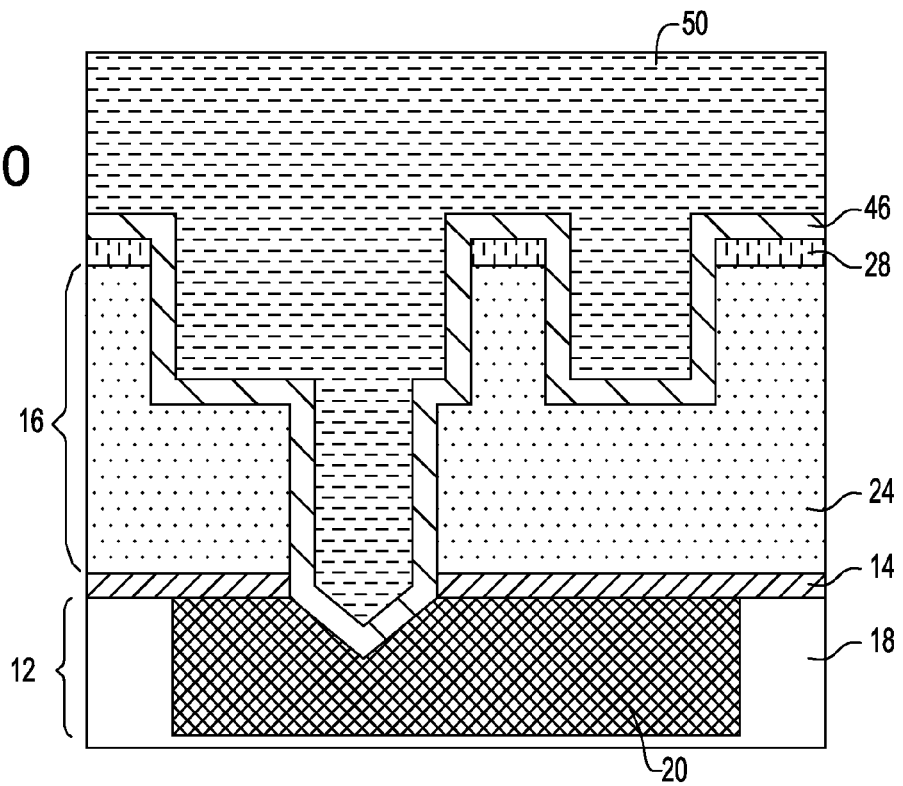
Figure 11:
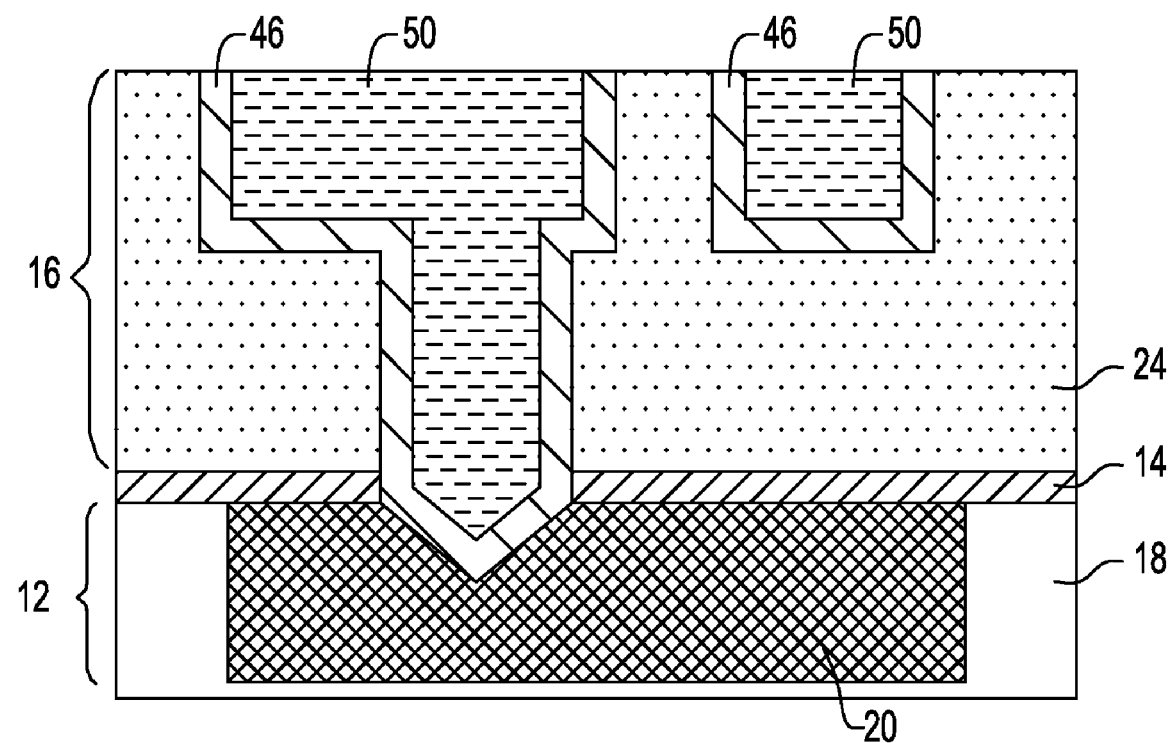

Reference is now made to FIG. 10 which illustrates the structure of FIG. 9 after filling the via and line openings as well as the gouging feature 32 with an interconnect conductive material 50. The interconnect conductive material 50 may comprise the same or different, preferably the same, conductive material (with the proviso that the conductive material is not polysilicon) as that of the conductive feature 20. Preferably, Cu, Al, W or alloys thereof are used, with Cu or AlCu being most preferred. The conductive material 50 is formed utilizing the same deposition processing as described above in forming the conductive feature 20.

After providing the structure shown in FIG. 10, the structure is subjected to a conventional planarization process such as, for example, chemical mechanical planarization and/or grinding. The planarization process removes various materials that are located atop the second low k dielectric material 24 of the upper interconnect level 16. The planarized structure is shown, for example, in FIG. 11. It is noted that in FIG. 11, the conductive material 50 and the diffusion barrier 46, each have an upper surface that is coplanar with the second dielectric material 24.

The method of the present application is applicable in forming additional interconnect levels atop the levels depicted in FIGS. 2-11. Each of the various interconnect levels would include the gouging feature described hereinabove.

Because of the integration processing scheme described above, no damaged regions are formed into the second dielectric material 24 during the formation of the gouging feature 32.

Moreover, the inventive integration process allows for continuous coverage of the diffusion barrier 46 in the metallic line regions which has a uniform thickness (i.e., a thickness variation of less than 2 nm). Since diffusion barrier 46 coverage is continuous in the line regions of the inventive interconnect structure and no damages (represented by a thickness variation at the bottom of the line opening which is less than 20 Å) are introduced into the interconnect dielectric material, the inventive interconnect structure has improved wiring reliability and a lower-level of metal-metal leakage than the interconnect structure shown in FIGS. 1A-1E. It should be also noted that only a single diffusion barrier 46 is present inside the via openings 26.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor structure comprising:
a lower interconnect level including a first dielectric material having at least one conductive feature embedded therein;
a dielectric capping layer located on said first dielectric material and some, but not all, portions of the at least one conductive feature; and
an upper interconnect level including a second dielectric material having at least one conductively filled via and an overlying conductively filled line disposed therein, wherein said conductively filled via is in contact with an exposed surface of the at least one conductive feature of said first interconnect level by an anchoring area, wherein
said conductively filled via and conductively filled line are separated from said second dielectric material by a single continuous diffusion barrier layer, and wherein no sputter induced damaged regions are present within horizontal surfaces of the second dielectric material that are located adjacent to said conductively filled line.

2. The semiconductor structure of claim 1 wherein said first and second dielectric materials comprise the same or different low k dielectric having a dielectric constant of about 4.0 or less.

3. The semiconductor structure of claim 1 wherein said dielectric capping layer comprises one of SiC, $Si_4NH_3$, $SiO_2$, a carbon doped oxide, a nitrogen and hydrogen doped silicon carbide SiC(N,H) or multilayers thereof.

4. The semiconductor structure of claim 1 wherein said at least one conductive feature embedded within said first dielectric material includes Cu or a Cu-containing alloy.

5. The semiconductor structure of claim 1 wherein said at least one conductively filled via and said at least one overlying conductively filled line comprise Cu or a Cu-containing alloy.

6. The semiconductor structure of claim 1 wherein said single continuous diffusion barrier layer comprises a metal-containing material selected from TaN, Ta, Ti, TiN, RuTa, RuTaN, W, WN, Ru and Ir.

7. The semiconductor structure of claim 1 further comprising an adhesion/plating seed layer, wherein said adhesion/plating seed layer is located between said single continuous diffusion barrier layer and said conductively filled via and line.

8. The semiconductor structure of claim 7 wherein said adhesion/plating seed layer comprises one of Ru, TaRu, Ir, Rh, Pt, Pd, Ta, Cu or alloys thereof.

9. The semiconductor structure of claim 1 further comprising a metallic interfacial layer within said anchoring area.

10. The semiconductor structure of claim 9 wherein said metallic interfacial layer comprises Co, TaN, Ta, Ti, TiN, Ru, Ir, Au, Rh, Pt, Pd, Ag or alloys thereof.

11. The semiconductor structure of claim 9 wherein said metallic interfacial layer is selected from the group consisting of Co, TaN, Ti, TiN, Ru, Ir, Au, Rh, Pt, Pd, Ag and alloys thereof.

12. The semiconductor structure of claim 9 wherein said metallic interfacial layer is selected from the group consisting of Co, TaN, Ti, TiN, Ru, Ir, Au, Rh, Pt, Pd and Ag.

13. The semiconductor structure of claim 9 wherein said metallic interfacial layer includes portions which extend above a topmost surface of said first dielectric layer.

14. A semiconductor structure comprising:
a lower interconnect level including a first dielectric material having at least one conductive feature embedded therein;
a dielectric capping layer located on said first dielectric material and some, but not all, portions of the at least one conductive feature;
an upper interconnect level including a second dielectric material having at least one conductively filled via and an overlying conductively filled line disposed therein, wherein said conductively filled via is in contact with said at least one conductive feature in said at least one first interconnect level by an anchoring area; and
a metallic interfacial layer located at a surface of said anchoring area and is in contact with said conductively filled via, wherein
said conductively filled via and said conductively filled line are separated from said second dielectric material by a single continuous diffusion barrier layer, and wherein no sputter induced damaged regions are present within horizontal surfaces of the second dielectric material that are located adjacent to said conductively filled line.

15. The semiconductor structure of claim 14 wherein said metallic interfacial layer comprises one of Co, TaN, Ta, Ti, TiN, Ru, Ir, Au, Rh, Pt, Pd, Ag and alloys thereof.

16. The semiconductor structure of claim 14 wherein said metallic interfacial layer is selected from the group consisting of Co, TaN, Ti, TiN, Ru, Ir, Au, Rh, Pt, Pd, Ag and alloys thereof.

17. The semiconductor structure of claim 14 wherein said metallic interfacial layer is selected from the group consisting of Co, TaN, Ti, TiN, Ru, Ir, Au, Rh, Pt, Pd and Ag.

18. The semiconductor structure of claim 14 wherein said metallic interfacial layer includes portions which extend above a topmost surface of said first dielectric layer.

19. A semiconductor structure comprising:
a lower interconnect level including a first dielectric material having at least one conductive feature embedded therein;
a dielectric capping layer located on said first dielectric material and some, but not all, portions of the at least one conductive feature;
an upper interconnect level including a second dielectric material having at least one conductively filled via and an overlying conductively filled line disposed therein, wherein said conductively filled via is in contact with an exposed surface of the at least one conductive feature of said first interconnect level by an anchoring area, wherein said conductively filled via and conductively filled line are separated from said second dielectric material by a single continuous diffusion barrier layer, and wherein no sputter induced damaged regions are present within horizontal surfaces of the second dielectric material that are located adjacent to said conductively filled line; and
a metallic interfacial layer within said anchoring area, wherein said metallic interfacial layer is selected from the group consisting of Co, TaN, Ti, TiN, Ru, Ir, Au, Rh, Pt, Pd, Ag and alloys thereof.

20. The semiconductor structure of claim 19 wherein said metallic interfacial layer includes portions which extend above a topmost surface of said first dielectric layer.

* * * * *